204-192.24 $$$ S?
08054 03 H 039

United States Statutory Invention Registration [19]

[11] Reg. Number: H39
[45] Published: Mar. 4, 1986

Gubser et al.

[54] MULTILAYER SUPER-CONDUCTING SHIELD AND METHOD OF MANUFACTURING SAME

[75] Inventors: Donald U. Gubser, Fairfax, Va.; Stuart A. Wolf, Greenbelt, Md.

[73] Assignee: The Government of the United States, Washington, D.C.

[21] Appl. No.: 762,365

[22] Filed: Aug. 5, 1985

[51] Int. Cl.[4] ..... H05K 9/00; C23C 14/24; H01L 39/12; H01L 39/24

[52] U.S. Cl. ..... 204/192 S; 174/35 MS; 174/126 S; 204/192 C; 204/192 EC; 29/599; 427/62; 428/35; 428/611; 428/662; 428/674; 428/930

[56] References Cited

PUBLICATIONS

Gubser et al. "Multilayer $Nb_3Sn$ Superconducting Shields", IEEE Transactions on Magnetics, vol. MAG-21, No. 2, Mar. 1985, pp. 320–323.

Clem, "Superconducting Magnetic Shielding for Squid-Based Systems Operating in Low Fields", IEE Transactions on Magnetics, vol. Mag-21, No. 2, Mar. 1985, pp. 606–609.

*Primary Examiner*—John F. Terapane
*Assistant Examiner*—Howard J. Locker
*Attorney, Agent, or Firm*—Robert F. Beers; William T. Ellis

[57] ABSTRACT

A multi-layer superconducting shield for shielding superconducting electronic devices from stray magnetic fields. In one embodiment the shield of the present invention comprises alternating concentric layers of a transition metal having a high transition temperature and a metal alloy formed from copper and a non-transition metal, said transition metal and metal alloy forming an interface, and a layer of $A_3B$-compound structure metal at the interface of said transition metal and metal alloy. The $A_3B$-compound structure metal is a high transition temperature superconductor.

In a second embodiment the superconducting shield comprises a thin film of a high transition temperature superconducting nitride compound deposited on a cylindrical substrate. The nitride is deposited by reactive rf sputtering.

16 Claims, 3 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

T
204/192.24

X
204-192.3

MULTILAYER SUPER-CONDUCTING SHIELD AND METHOD OF MANUFACTURING SAME

BACKGROUND OF THE INVENTION

The present invention relates to superconducting shields, and more particularly to a high-transition-temperature superconductive multilayer shield, designed, fabricated, and intended for use in low magnetic field applications, e.g., superconducting electronics.

The invention also relates to the particular construction of such a superconducting shield and a novel method of making the same whereby precise structural configurations are obtained in the resulting shield and the effectiveness of the shield is greatly enhanced.

Superconductivity is a phenomenon occurring at very low temperatures in many electrical conductors, in which the electrons responsible for conduction undergo a collective transition to an ordered state with many unique and remarkable properties. These include the vanishing of resistance to the flow of electric current, the protection from penetration of magnetic flux and the expulsion of magnetic flux from the interior of a superconductive shielded device. The temperature at which the transition occurs is called the transition or critical temperature, $T_c$.

There are two types of superconducting materials, appropriately named, "Type I" and "Type II". In Type I superconductors below a "critical magnetic field" $H_c$ which increases as the temperature decreases below $T_c$, the magnetic flux is excluded. If the applied field is increased above $H_c$, the entire superconductor reverts to the normal state and the field penetrates completely.

In Type II superconductors, there are two critical fields, the lower critical field $H_{cl}$ and the upper critical field, $H_{c2}$. In applied fields less than $H_{cl}$, the superconductor completely excludes the field, just as a type I superconductor does below $H_c$. At fields just above $H_{cl}$, however, flux begins to penetrate the superconductor in microscopic filaments called fluxoids or vortices. Each fluxoid consists of a normal core in which the magnetic field is large, surrounded by a superconducting region in which flows a vortex of persistent supercurrent which maintains the field in the core. In a sufficiently pure and defect-free type II superconductor, the fluxoids tend to arrange themselves in a regular lattice. This vortex state of the superconductor is known as the mixed state. It exists for applied fields between $H_{cl}$, and $H_{c2}$. At $H_{c2}$, the superconductor becomes normal and the field penetrates completely.

A type II superconductor in the mixed state is not necessarily completely lossless, however. The presence of an electric current creates a force on the fluxoids. They therefore tend to move. Moving magnetic flux creates voltages by electromagnetic induction, and the presence of nonzero voltages together with the current implies power dissipation. This loss mechanism can often be suppressed by introducing defects into the crystal structure of the superconductor which tend to pin down the fluxoids and prevent them from moving. This phenomenon is called flux pinning.

Superconducting devices perform functions in the superconducting state that would be difficult or impossible at room temperature. One such device, the SQUID, Superconducting Quantum Interference Device, is used for detecting changes in magnetic flux. The SQUID employs superconducting magnetic shielding to isolate it from external magnetic fields. Without such shielding, changes in the external field can induce anomalous signals in the SQUID.

Superconducting shields for use in low magnetic field environments such as those surrounding field sensitive superconducting electronics, are generally fabricated from Pb or Nb. Of these two, Pb is usually the most reliable since it is the easiest to work with in the fabrication process and is easier to seal overlapping joints. It is also a clean, type I superconductor which exhibits good flux expulsion.

Nb shields are mechanically stronger and the Nb transition temperature is higher (9.2 Kelvin vs. 7.2 Kelvin). Hence, Nb shields are also frequently used. Some care must be taken however to ensure good overlapping joints at the ends of the shield. Also since Nb is a type II superconductor with stronger flux pinning forces than Pb the shields need to be carefully annealed to ensure minimal flux trapping.

Shields fabricated from NbTi are sometimes used since they are easier to machine than pure Nb. NbTi, however is an extreme type II superconductor with strong pinning forces making annealing even more important than in Nb. Also, being an alloy, composition gradients can exist in NbTi if it is not properly homogenized. Flux trapping and flux motion often are problems with NbTi shields if they are not carefully annealed to reduce the material inhomogeneities.

Shields fabricated from higher transition temperature superconducting compounds have been developed mainly for those applications requiring shielding of large magnetic fields (largely due to high values of trapped magnetic flux). The higher transition temperatures offer many advantages for low field applications as well and will become increasingly more important as superconducting electronics begin to operate at temperatures achieveable with small closed cycle refrigerators, i.e., 8–10 K. Even with operating temperatures of 4.2 K, higher $T_c$ shields are important in situations where precise temperature stability cannot be assured.

Achieving good shielding characteristics has proven difficult in prior art shields because of imperfect materials used in shield construction, difficulty fabricating magnetically "tight" shields with anything except lead (Pb), "trapped magnetic flux" during cool down, thermal drifts during temperature fluctuations, and random noise due to magnetic flux motion.

SUMMARY OF THE INVENTION

Accordingly, an object of the invention is to provide a stable low-magnetic field environment for operation of superconducting devices which are sensitive to magnetic field changes.

A further object of the invention is to disclose a method of fabricating magnetically "tight" multilayer shields.

These and other objects are achieved in one embodiment by a multilayer superconducting shield which includes alternating concentric layers of a transition metal having a high transition temperature and a metal alloy formed from copper and a non-transition metal, said transition metal and metal alloy forming an interface, and a layer of $A_3B$-compound structure metal at the interface of the transition metal layer and metal alloy layer, said $A_3B$-compound being a high transition temperature superconductor.

The shields of the first embodiment are fabricated by alternately wrapping overlapping sheets of a transition metal having a high transition temperature, with sheets of a metal alloy formed from copper and one of the non-transition metal elements, extruding said overlapping sheets to form a rod of a desired diameter, reacting said extruded rod to form a $A_3B$-compound structure metal at the interface between said transition metal layer and metal alloy layer.

In a second embodiment, the superconducting shield comprises a thin film of a high transition temperature superconducting nitride compound deposited on a cylindrical substrate by reactive rf sputtering.

The shields of this embodiment are fabricated by providing a clean conventional vacuum sputtering chamber, backfilling said chamber with a high purity argon, providing a sputtering target of a transition metal having a high transition temperature, suspending a rotatable substrate within said vacuum chamber, igniting the argon to start the reacting process, and injecting nitrogen into the vacuum sputtering chamber thereby depositing a high transition temperature superconducting nitride compound onto said substrate.

The high $T_c$ high flux pinning materials are extremely brittle. The present method optimizes the superconducting parameters while minimizing the extreme brittleness of these materials.

Two advantages of the shield manufactured by the present method are (1) its characteristic of maintaining a constant low value trapped magnetic field as the ambient temperature varies, and (2) its temperature insensitivity.

DESCRIPTION OF THE PREFERRED EMBODIMENT

Figure 1:
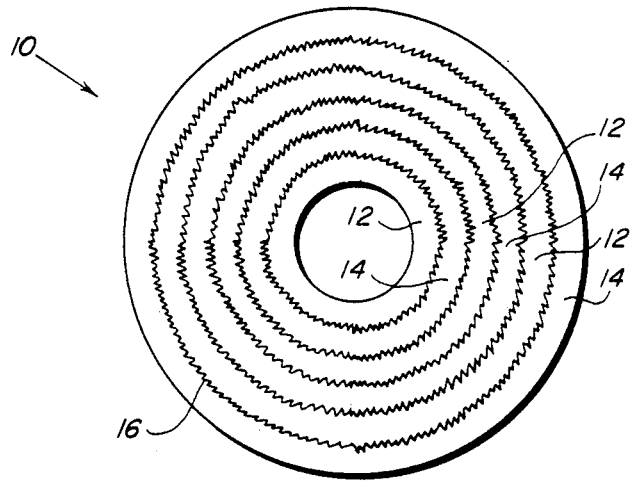
FIG. 1 is a cross sectional view of one embodiment of the present invention showing concentric rings formed after the extrusion process.

Referring now to the drawings, wherein like reference characters designate like or corresponding parts throughout the views, FIG. 1 shows one embodiment of the present invention. The multilayer superconducting shield 10 of the present invention comprises alternating concentric layers of a transition metal 12 having a high transition temperature and a metal alloy 14 formed from copper and one of the non-transition metal elements of the periodic table, and a layer of high transition temperature $A_3B$-compound structure metal 16 at the interface between said transition metal layer and metal alloy layer.

While the superconducting shield 10 may take a variety of forms and comprise of a variety of materials it may conveniently take the form shown in FIG. 1 of a cylindrical closed surface. A cylindrical configuration is desirable because its geometry allows total encapsulation of the superconducting device to be shielded. The shield is shown in FIG. 1 with the transition metal layer 12 fabricated of niobium (Nb) and the metal alloy layer 14 fabricated of copper-tin (10 at %) bronze (CuSn). The $A_3B$ structure-compound 16 at the interfaces between the first and second metals, 12 and 14 respectively, is niobium-tin ($Nb_3Sn$) and necessarily follows when the first and second metal layers are niobium and copper-tin respectively.

By way of example each sheet of Nb and CuSn is approximately 3–5 mils in thickness.

In the preferred embodiment of this invention, three such Nb sheets 12 are interleaved with three bronze sheets 14, and contained in a copper can and then extruded into rods of 2 meters in length and with an outside diameter of 1.6 cm. The term extruding is used herein to generally describe any process used to shape the cross-sectional area of a can into a rod.

Figure 2:
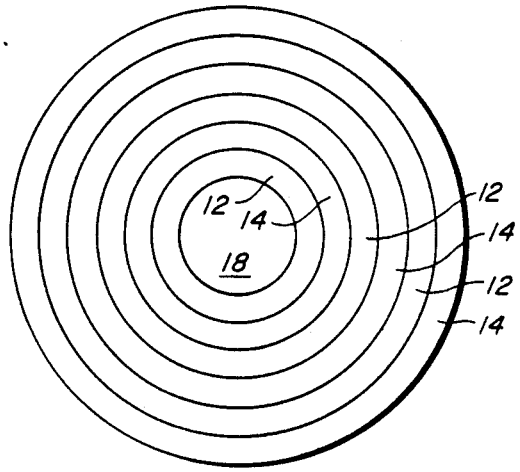
FIG. 2 is a cross sectional view of one embodiment of the present invention showing the alternating layers of metal and the $A_3B$-compound structure metal formed at the interfaces.

The Nb sheets 12 in these rods formed closed concentric cylinders 12 and 14 after the extrusion process, as illustrated in FIG. 2. The metals are shown alternately wrapped about a bronze mandrel 18. Though the mandrel 18 is stated as bronze it may be of any general type known in the art. The initial diameter of the mandrel 18 depends on the inside diameter of the desired shield.

The rods produced by the extrusion process are then cut to the approximate shield length. After cutting, the rods are reacted in a vacuum furnace between 700° C. and 800° C. for about 100 hours. The process of reacting is meant to include any method of forming a new compound using heat.

The reacting process forms layers of $Nb_3Sn$ 16 at the interfaces of the Nb 12 and bronze alloy 14 cylinders of FIG. 1. The average thickness of the layers varied according to the reactor temperature. Averge thicknesses of 7 micrometers were obtained at a reaction temperature of 750° C. and 25 micrometers at 800° C. The shields with thinner $Nb_3Sn$ walls displayed greater shielding characteristics.

Again referring to FIG. 1, the final product is formed by machining the reacted rod on a lathe to the final length, striping the copper can, and drilling a central hole.

In this embodiment, the final dimension of the shields were:

Length = 12 centimeters;
inner diameter = 1.1 centimeters;
outer diameter = 1.5 centimeters.

The diameter of the inner and outer $Nb_3Sn$ layers were 1.2 centimeters and 1.4 centimeters, respectively.

The shield disclosed above is fabricated of $Nb_3Sn$ and is considered the best for this shield concept. However, shields of $V_3Ga$ may be fabricated by substituting vanadium for niobium and by substituting Cu-Ga alloy for the Cu-Sn alloy. The $V_3Ga$ shield was functionally equivalent to the $Nb_3Sn$ composition.

The way in which a superconductor excludes from its interior an applied magnetic field smaller than $H_c$ (type I) or $H_{cl}$ (type II) is by establishing a persistent supercurrent on its surface which exactly cancels the applied field inside the superconductor. This surface current flows in a very thin layer of thickness $\lambda$, which is called the penetration depth. The external field also actually penetrates the superconductor within this penetration depth. $\lambda$, depends on the material and on the temperature, the latter dependence being given approximately by $$\lambda = \lambda_o[1-(T/T_c)^4]^{-1} \quad (1)$$

($\lambda_o$ is the penetration depth at zero temperature for the particular material, and is typically of order $5\times10^{-8}$m). By designing a shield with a large $T_c$ compared to the ambient temperature T, the component $$[T/T_c]^4 \quad (2)$$

approaches a negligible value in equation 1. By removing the temperature dependence in equation 1, $\lambda$ becomes a constant equal to $\lambda_o$, and the temperature dependence of $\lambda$ at low temperatures is of no practical consequence.

In ideal situations (constant temperature) the trapped magnetic flux $\phi$ trapped inside the shield in a constant value equal to the ambient magnetic field multiplied by the cross sectional area of the interior of the shield. See equation 2.

$$\phi = B \times A = \text{Constant} \quad (3)$$

The trapped magnetic field varies with temperature depending on the materials used.

For a cylindrical shield the magnetic field varies according to the equation.

$$\Delta B = \phi / A^2 P \Delta\lambda) \quad (4)$$

where $\Delta\lambda$ is the temperature induced changes in the penetration depth value and P is the perimeter of the inside surface of the shield. By using the temperature dependence for $\lambda$ in (Eq. 1) one can show that $$\Delta B \simeq 4\phi / A^2 P \lambda_o T^3 / T_c^4 \Delta T \quad (5)$$

for a cylindrical shield. When $T_c$ is large compared to T the variation of B is of no consequence Additionally, when operating in low applied magnetic fields, the trapped flux will correspondingly be a low value and this will also contribute to a small $\Delta B$.

In the above embodiments it is not important whether the high $T_c$ material or copper-alloy is first wrapped about the mandrel 18.

Figure 3:
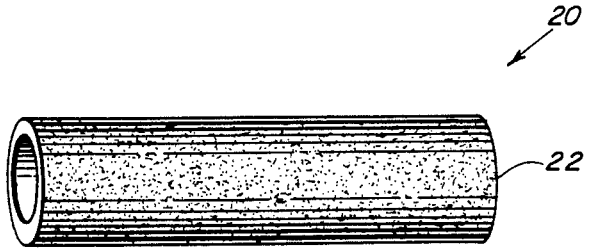
FIG. 3 is a cross sectional view of a second embodiment of the invention whereby thin films of superconducting compound are sputter deposited onto a cylindrical substrate.

Referring now to FIG. 3, there is disclosed a second embodiment of the present invention. For purposes of illustration only, the superconducting shield 20 is shown formed from a thin film of a high transition temperature superconducting nitride compound 22 which is deposited on a closed concentric substrate (not shown) by reactive rf sputtering. After fabrication the substrate is removed.

From recognizing the need to fabricate superconducting shields of, high transition temperature superconducting compounds, the inventors have additionally determined that high quality superconducting shields can be fabricated by conventional rf reactive sputtering techniques. To illustrate the technique the inventors fabricated shields of niobium nitride (NbN) and niobium carbonitride (Nb(NC)). The following steps, including stated numerical values, are for purposes of illustration only. The novelty of the invention is not in using conventional rf reactive sputtering techniques, but in the realization that shields of high superconducting quality can be fabricated by the following process.

A conventional vacuum chamber was cleaned and maintained prior to the process at a pressure of $3 \times 10^{-9}$ torr. Cleaning may be performed by any technique however the inventors chose to use an ion pump, several liquid nitrogen shrouds and a filament titanium sublimation pump. The chamber was then back filled with high purity argon to a pressure of approximately $50 \times 10^{-3}$ torr.

It was desired for this embodiment to fabricate shields of NbN or Nb(CN) thus accordingly a Niobium target was used. The target was precleaned in a argon plasma at a power density of 5 watts-cm$^{-2}$ for approximately 15 minutes.

The present shield was developed in order to provide greater shielding protection for SQUID devices, thus accordingly a shield of a closed concentric configuration is desired. For this embodiment a cylindrical substrate fabricated of, for example, quartz or sapphire was provided. The substrate was precut to the desired final dimensions of the shield then precleaned and heated to approximately 500° centigrade. The substrate is heated to improve the crystal structure formation of the superconductor compound formed thereon. In this embodiment the substrate was heated by radiation from several carbon strip heaters. Because the properties of superconducting materials are easily degraded by impurities and oxygen it is important that the substrate, be very clean especially since the surface of the superconducting film in contact with the substrate is the most important surface in providing the magnetic shielding.

The cylindrical substrates were next placed on a rotator and suspended below the high purity niobium sputtering target. The argon within the chamber was ignited by an are to initiate the reacting process. Nitrogen was then bled into the chamber adding about $15 \times 10^{-3}$ torr to the total vacuum pressure of the chamber. The niobium target reacted with the nitrogen to form the nitride which was thereby sputtering onto the revolving cylindrical substrate using a power density of about 15 watts/cm$^2$. The film was deposited onto the substrate at a rate of approximately 100 angstroms per minute and to a total thickness of at least one micrometer. To form niobium carbonitride (Nb(CN)) on the substrate a mixture of nitrogen and cyanogen was bled into the chamber instead of nitrogen alone.

Obviously, numerous (additional) modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. A multilayer superconductor shield which comprises:

alternating concentric layers of a transition metal having a high transition temperature and a metal alloy formed from copper and a non-transition metal, said transition metal and metal alloy forming an interface; and a layer of $A_3B$-compound structure metal at the interface of said metals, said $A_3B$-compound structure metal being a high transition temperature superconductor.

2. The multilayer superconductor shield of Claim 1, wherein said transition metal is chosen from the group consisting of vanadium, niobium, and tantalum.

3. The multilayer superconductor shield of claim 2, wherein said non-transition metal is chosen from the group consisting of gallium and tin.

4. A multilayer superconductor shield as claimed in claim 1, wherein said transition metal is niobium and said copper and non-transition metal alloy is copper-tin bronze and said $A_3B$-compound structure metal at the interface between said first and second metals is niobium-tin.

5. A multilayer superconductor shield as claimed in claim 1, wherein said transition metal is vanadium and said copper and non-transition metal alloy is copper-gallium bronze and said $A_3B$-compound structure metal at the interface between said first and second metals is vanadium-gallium.

6. A method of manufacturing a high transition temperature superconducting shield, comprising the steps of:

wrapping alternating sheets of a transition metal and a copper and non-transition metal alloy around a mandrel, said transition metal having a high transition temperature;

extruding said wrapped sheets to form a rod of a desired diameter, said wrapped sheets being cold welded by said extrusion process and said sheets forming an interface;

reacting said extruded rod within a temperature range of 700° C. and 800° C. to form a layer of $A_3B$-compound structure metal at the interface of said transition metal and said copper and non-transition metal alloy, said $A_3B$-compound structure metal being a high transition temperature superconductor.

7. A method of manufacturing a high transition temperature superconducting shield, as claimed in claim 6, wherein said transition metal is chosen from the group consisting of niobium, vanadium and tantalum.

8. A method of manufacturing a high transition temperature superconducting shield, as claimed in claim 7, wherein said non-transition metal is chosen from the group consisting of gallium and tin.

9. The method of claim 6 wherein said reacting step is performed within the range of 740° C. and 760° C.

10. A method of manufacturing superconducting shields of transition metals having high transition temperatures for use in magnetic shielding applications by the process of reactive rf sputtering, comprising the steps of:

providing a clean conventional vacuum sputtering chamber, said chamber prepumped to a pressure of approximately $3\times10^{-9}$ torr;

backfilling said vacuum chamber with high purity argon to a pressure of approximately $50\times10^{-3}$ torr;

providing a sputtering target of niobium;

suspending a rotatable substrate within said vacuum chamber; and igniting the aron to start the reacting process;

injecting nitrogen into the vacuum sputtering chamber thereby depositing niobium nitride onto said rotating substrate, said niobium nitride deposited at a power density of about 15 watts$-$cm$^{-3}$ to a thickness of approximately 1 micron.

11. The method of claim 10 including the additional step of heating said substrate to improve the crystallization process of the niobium nitride on the substrate.

12. The method of claim 10 including the additional step of precleaning said niobium target in an argon plasma at a power density of approximately 5 watts$-$cm$^{-3}$ for approximately 15 minutes.

13. A method of manufacturing superconducting shields of transition metals having high transition temperatures for use in magnetic shielding applications by the process of reactive rf sputtering, comprising the steps of:

providing a clean conventional vacuum puttering chamber, said chamber prepumped to a pressure of approximately $3\times10^{-9}$ torr;

backfilling said vacuum chamber with high purity argon to a pressure of approximately $50\times10^{-3}$ torr;

providing a sputtering target of niobium;

suspending a rotatable substrate within said vacuum chamber; and igniting the argon to start the reacting process;

injecting nitrogen and carbon into the vacuum sputtering chamber thereby depositing niobium carbonitride onto said rotating substrate, said niobium carbonitride deposited at a power density of about 15 watts$-$cm$^{31\ 3}$ to a thickness of approximately 1 micron.

14. A superconductor shield which comprises a thin film of a high transition temperature superconductingnitride compound formed by reactive rf sputtering.

15. A superconductor shield as claimed in claim 14, wherein said high transition temperature superconducting nitride compound is niobium nitride.

16. A superconductor shield as claimed in claim 14, wherein said high transition temperature superconducting nitride compound is niobium carbonitride.

* * * * *